US006850554B1

(12) United States Patent
Sha et al.

(10) Patent No.: US 6,850,554 B1
(45) Date of Patent: Feb. 1, 2005

(54) CIRCUIT AND METHOD FOR CONTROLLING A SPREAD SPECTRUM TRANSITION

(75) Inventors: I-Teh Sha, Santa Clara, CA (US); Kuang-Yu Chen, Saratoga, CA (US); Albert Chen, Saratoga, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/436,522

(22) Filed: Nov. 9, 1999

(51) Int. Cl.[7] .............................................. H03D 1/04
(52) U.S. Cl. ...................... 375/140; 375/139; 375/149; 327/148; 327/157
(58) Field of Search ................................ 375/130, 149, 375/139, 140; 327/157, 148

(56) References Cited

U.S. PATENT DOCUMENTS

| | | | |
|---|---|---|---|
| 4,578,649 A | 3/1986 | Shupe ........................ | 331/78 |
| 5,148,447 A | 9/1992 | Ito ............................... | 375/7 |
| 5,204,877 A | 4/1993 | Endo et al. ..................... | 375/1 |
| 5,226,058 A | 7/1993 | Anderson et al. ............. | 375/1 |
| 5,416,434 A | 5/1995 | Kootstra et al. ............ | 327/113 |
| 5,488,627 A * | 1/1996 | Hardin et al. ................ | 375/139 |
| 5,491,458 A | 2/1996 | McCune, Jr. et al. ....... | 332/144 |
| 5,631,920 A * | 5/1997 | Hardin ........................ | 375/130 |
| 6,292,507 B1 * | 9/2001 | Hardin et al. ............... | 327/148 |
| 6,377,646 B1 * | 4/2002 | Sha ............................. | 375/376 |
| 6,590,949 B1 * | 7/2003 | Marten et al. .............. | 375/376 |

FOREIGN PATENT DOCUMENTS

| EP | 0655829 | 5/1995 |
|---|---|---|
| EP | 0739089 | 10/1996 |

OTHER PUBLICATIONS

Young et al., "A PLL clock generator with 5 to 10 MHz of lock range for microprocessors", Solid–State Circuits, IEEE Journal of, vol.:27, Issue:11, Nov. 1992 pp.:1599–1607.*

Hardin et al., "Design considerations of phase–locked loop systems for spread spectrum clock generation compatibility", Electromagnetic Compatibility, 1997. IEEE 1997 International Symposium on, Aug. 18–22, 1997 pp.:302–307.*

Circuit and Method For Linear Control of a Spread Spectrum Transition, US. Appl. No. 09/436,155, filed Nov. 9, 1999.

* cited by examiner

Primary Examiner—Young T. Tse
Assistant Examiner—Edith Chang
(74) Attorney, Agent, or Firm—Christopher P. Maiorana, PC

(57) ABSTRACT

A circuit and method for controlling a spread spectrum transition are presented comprising a first circuit and a second circuit. The first circuit may be configured to generate a clock signal in response to (i) a reference signal, (ii) a sequence of spread spectrum ROM codes, and (iii) a command signal. The second circuit may be configured to synchronize the command signal to a feedback signal. The sequence of spread spectrum ROM codes may be generated according to a predetermined mathematical formula and optimized in accordance with predetermined criteria.

23 Claims, 8 Drawing Sheets

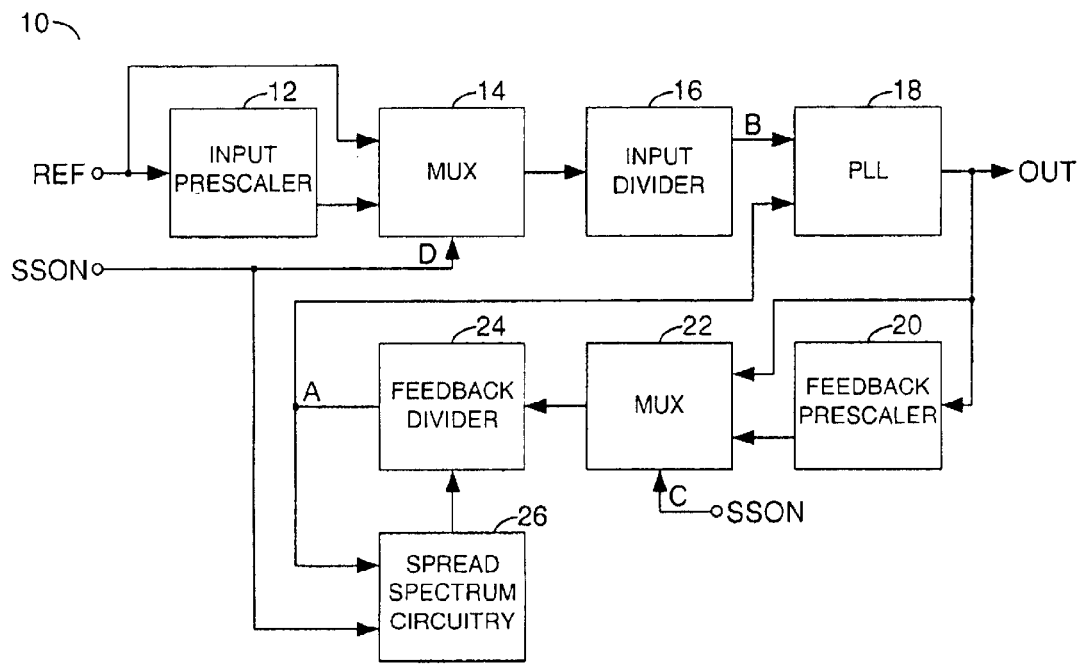
(CONVENTIONAL)
FIG. 1

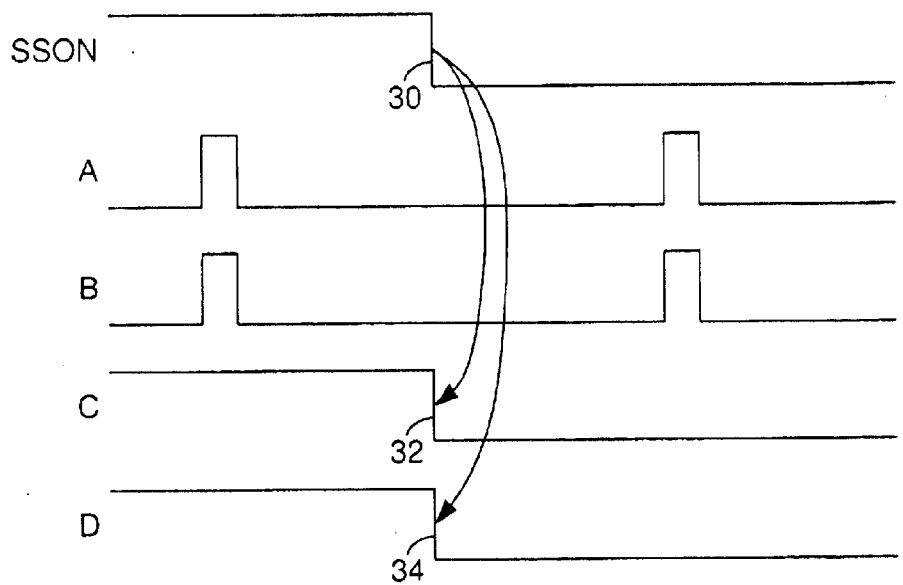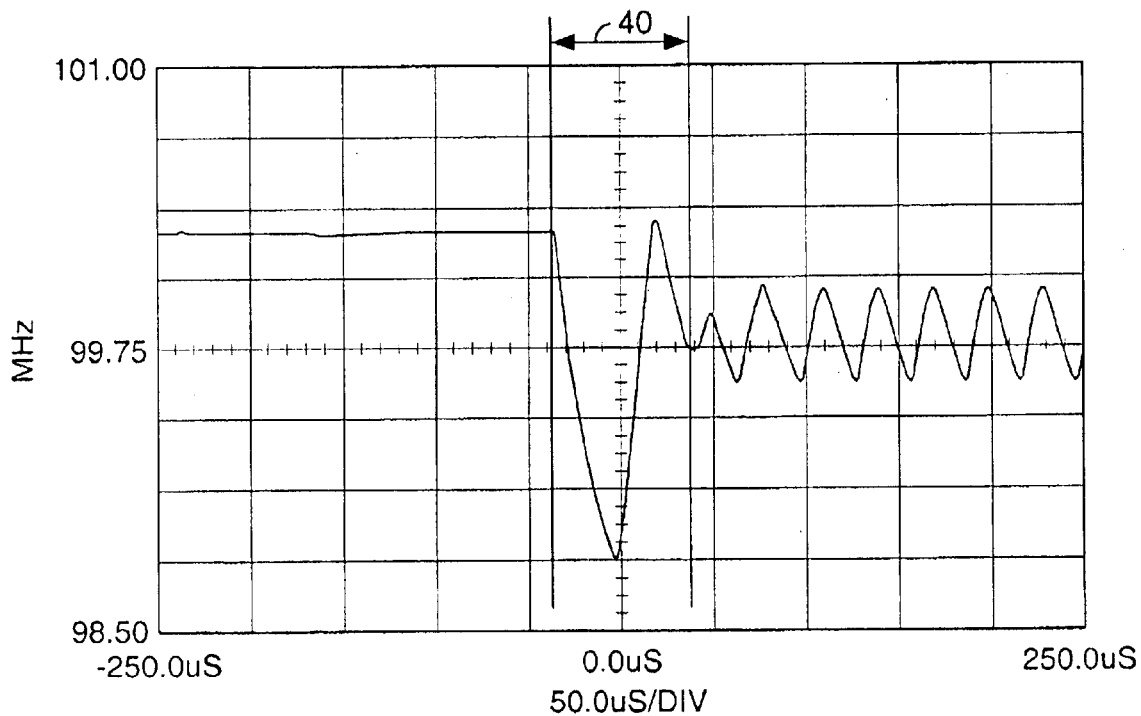
(CONVENTIONAL)
FIG. 2

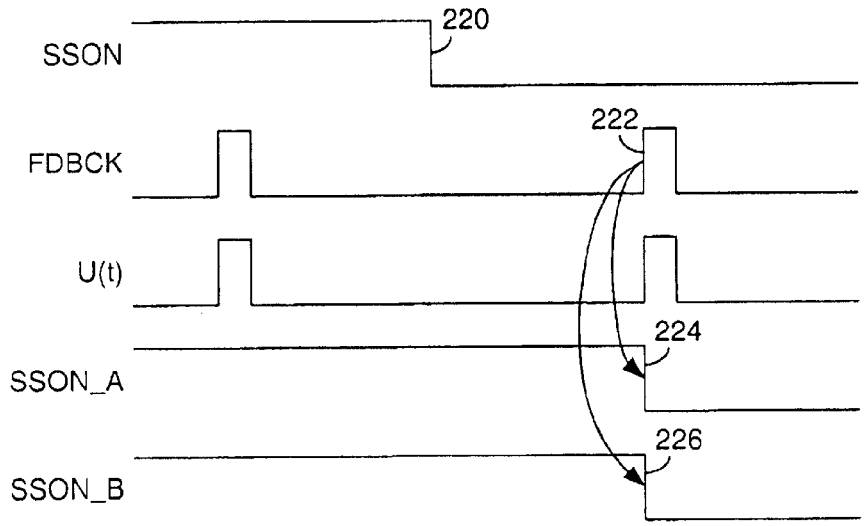
SPREAD SPECTRUM TRANSITION BEHAVIORS ARE CONTROLLED BY THE PROGRAM
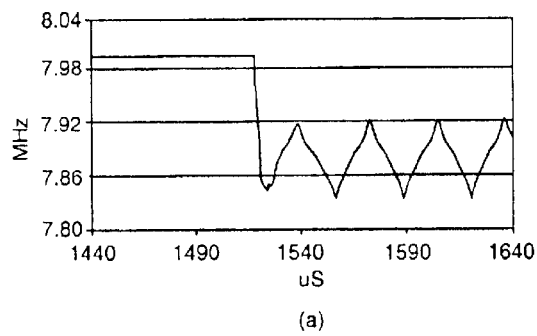
(a)
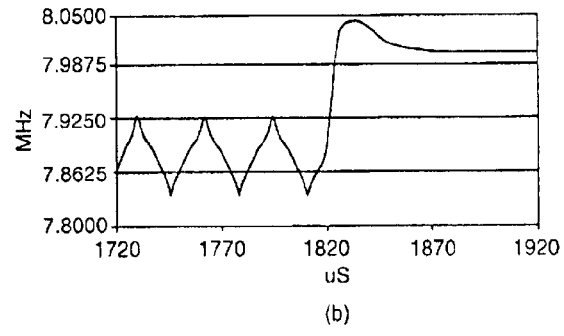
(b)
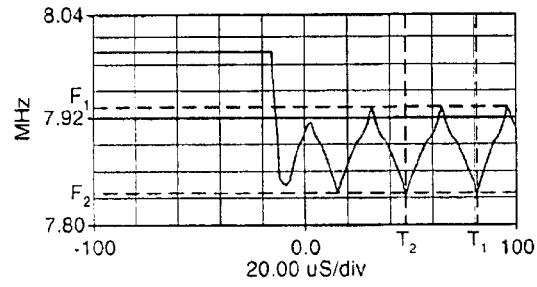
$T_1$ = 49.33uS    $T_2$ = 01.33uS    Δ = 32.00uS
$F_1$ = 7.93125MHz    $F_2$ = 7.83750MHz    Δ = -93.75KHz
MEAN = 7.9401907MHz    PK - PK = 173.44KHz
(a)
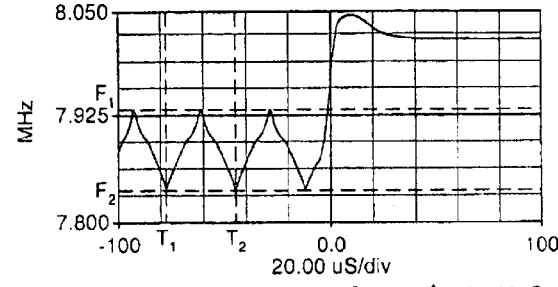
$T_1$ = -76.89uS    $T_2$ = -44.89uS    Δ = 32.00uS
$F_1$ = 7.93125MHz    $F_2$ = 7.83750MHz    Δ = -93.75KHz
MEAN = 7.9530444MHz    PK - PK = 206.85KHz
(b)
FIG. 6

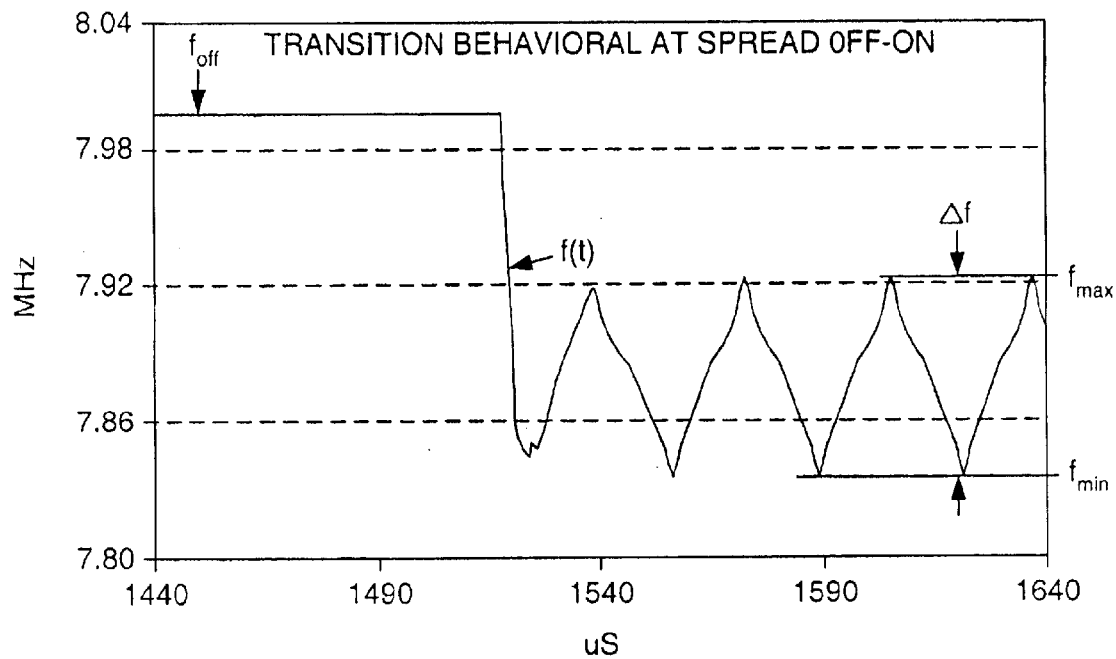

CRITERIA FOR DETERMINING "GOOD AND BAD" SS TRANSIENT BEHAVIOR $f(t)$ : PLL's RUNNING FREQUENCY IN TRANSIENT PERIOD $f_{off}$ : PLL's SSCG OFF FREQUENCY $f_{max}$ : MAXIMUM FREQUENCY IN SSCG ON $f_{min}$ : MINIMUM FREQUENCY IN SSCG ON $\Delta f$ : PEAK TO PEAK FREQUENCY IN SSCG

CRITERIA NEED TO BE SATISFIED:

FREQUENCY RUNNING RANGE DURING TRANSIENT $\quad f_{min} \leq f(t) \leq f_{off}$

FIG. 7

CIRCUIT AND METHOD FOR CONTROLLING A SPREAD SPECTRUM TRANSITION

CROSS-REFERENCE TO RELATED APPLICATIONS

The present invention relates to application Ser. No. 09/436,155 filed on Nov. 9, 1999, now U.S. Pat. No. 6,553,057, issued on Apr. 22, 2003, which is hereby incorporated by reference in its entirety.

FIELD OF THE INVENTION

The present invention relates to spread spectrum clock generators generally and, more particularly, to a circuit and method for controlling a spread spectrum transition.

BACKGROUND OF THE INVENTION

Electronic devices must meet maximum electromagnetic interference (EMI) radiation limits as specified by the U.S. FCC and other comparable regulatory agencies in other countries. New FCC requirements call for PC motherboards to be able to pass EMI tests "open box," so manufacturers will not be able to rely on the shielding provided by the case in meeting EMI requirements.

An EMI suppression-enabled clock IC can reduce the system radiated EMI. The reduction in radiated EMI can result in dramatic cost savings for the system. Conventional techniques for reducing EMI include ground planes, filtering components, shielding, and spread spectrum modulated system clocks.

In the spread spectrum technique, instead of concentrating all of a frequency reference's energy on a single frequency, the energy is spread out by modulating the frequency. The modulation results in the energy being spread over a frequency range, instead of being concentrated on one particular frequency. Since the FCC and other regulatory bodies are concerned with peak emissions, not average emissions, the reduction in peak energy due to spread spectrum modulation will help a product meet FCC requirements.

One type of spread spectrum modulation is center modulation (e.g., +/−). A center modulated clock provides the same system processing performance as for a CPU using a non-modulated clock. However, system designers are concerned about overboosting processors. If a processor designed for a 100 MHz reference is used with a reference that spends most of the time at 100.5 MHz, the processor will be operating at a higher than rated speed during that period of time. To alleviate this concern, modulation can be specified as "down only," e.g., −0.5%. A −0.5% modulation, in the same 100 MHz example, would vary the frequency from 99.5 to 100 MHz. This is achieved by moving the center frequency down. What is specified as "100 MHz, with −0.5% modulation" can really be thought of as "99.75 MHz with +/−0.25% modulation." Using "down only" modulation results in a performance degradation of a CPU, as the nominal 100 MHz signal is now less than 100 MHz.

If the spread spectrum clock generator could be configured for the spread spectrum modulation to be switched on and off, a system could have reduced EMI while still providing top performance when needed. However, during the transition period when the spread spectrum modulation is switching on or switching off, the frequency can undershoot or overshoot the rated input frequency range of the CPU. When the undershoot or overshoot exceeds the clock input frequency range of the processor, tracking loss and hanging can result.

Referring to FIG. 1, a block diagram of a circuit 10 illustrating a conventional phase lock loop based spread spectrum clock generator is shown. The circuit 10 generates a signal OUT in response to (i) a reference signal REF and a command signal SSON. The signal REF is presented to an input prescaler 12 and a multiplexer 14. The signal OUT is presented to a feedback prescaler 20 and a multiplexer 22. The signal SSON is presented to (i) the control inputs of the multiplexers 14 and 22 and (ii) the spread spectrum circuitry 26. In response to the command signal SSON, (i) the multiplexer 14 selects between the reference signal REF and an output of the input prescaler 12, (ii) the multiplexer 22 selects between the output signal OUT and an output of the feedback prescaler 20 and (iii) the spread spectrum circuitry modulates the signal out.

Referring to FIG. 2, a timing diagram and an oscilloscope tracing illustrating signals of the circuit 10 are shown. The timing diagram illustrates that a transition 30 in the signal SSON results in an immediate transition at the control inputs of the multiplexers 14 and 22. A portion 40 of the oscilloscope tracing illustrates the large transient response of the circuit 10 when spread spectrum modulation is switched on.

SUMMARY OF THE INVENTION

The present invention concerns a circuit and method for controlling a spread spectrum transition comprising a first circuit and a second circuit. The first circuit may be configured to generate a clock signal in response to (i) a reference signal, (ii) a sequence of spread spectrum ROM codes, and (iii) a command signal. The second circuit may be configured to synchronize said command signal to a feedback signal. The sequence of spread spectrum ROM codes may be generated according to a predetermined mathematical formula and optimized in accordance with predetermined criteria.

The objects, features and advantages of the present invention include providing a circuit and method that may (i) reduce overshoot and/or undershoot in the transient response of a spread spectrum clock generator, (ii) provide for synchronization of dividers and prescalers, and (iii) use a computer program to determine transient and steady-state spread spectrum behavior of a spread spectrum device.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional spread spectrum clock generator circuit;

FIG. 2 is a timing diagram and an oscilloscope trace illustrating various signals of the conventional spread spectrum clock generator of FIG. 1;

FIG. 6 is a timing diagram and an oscilloscope trace of various signals of the circuit of FIG. 4;

FIG. 7 is a diagram illustrating criteria used in determining when a sequence of spread spectrum ROM codes may be optimized;

DETAILED DESCRIPTION OF THE PREFERRED EMBODIMENTS

Figure 3:
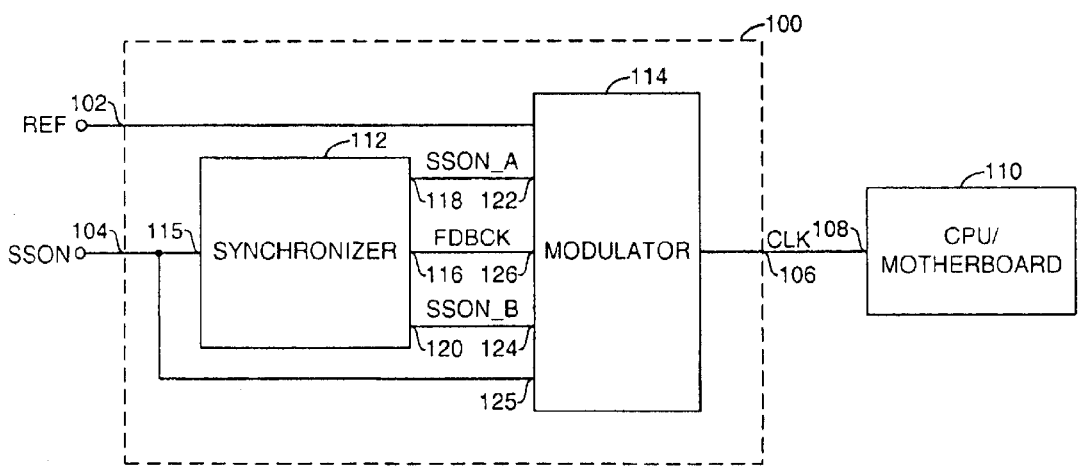
FIG. 3 is a block diagram illustrating a spread spectrum clock generator circuit in accordance with a preferred embodiment of the present invention.

Referring to FIG. 3, a block diagram of a circuit 100 is shown in accordance with a preferred embodiment of the present invention. The circuit 100 may be implemented, in one example, as a spread spectrum clock generator circuit. The circuit 100 may have a clock input 102, a control input 104, and an output 106. A reference signal (e.g., REF) is generally presented to the input 102. A command signal (e.g., SSON) is generally presented to the input 104. The circuit 100 may be configured to generate a clock signal (e.g., CLK) at the output 106 in response to (i) the signal REF and (ii) the signal SSON. When the signal SSON is in a first state (e.g., a logic "0", or LOW), the signal CLK may be an unmodulated clock signal. When the signal SSON is in a second state (e.g., a logic "1", or HIGH), the signal CLK may be a spread spectrum modulated clock signal. The particular polarity of the signal SSON may be changed to meet the design criteria of a particular application. The signal CLK may be presented, in one example, to a clock input 108 of a CPU/Motherboard (or other device requiring a clock input) 110.

The circuit 100 generally comprises a circuit 112 and a circuit 114. The circuit 112 may be, in one example, a synchronizer circuit. The circuit 114 may be, in one example, a modulator circuit. The signal SSON is generally presented at an input 115 of the circuit 112. A feedback signal (e.g., FDBCK) is generally presented at an input 116 of the circuit 112. In one example, the circuit 112 may be configured to generate (i) a first control signal (e.g., SSON_A) at an output 118 and (ii) a second control signal (e.g., SSON_B) at an output 120 in response to (i) the signal SSON and (ii) the signal FDBCK.

The circuit 114 may have an input 122, an input 124, an input 125, and an output 126. The circuit 114 may be configured to receive the signal REF from the input 102. The signal SSON_A is generally presented to the input 122. The signal SSON_B is generally presented to the input 124. The signal SSON is generally presented to the input 125. The circuit 114 may be configured to generate (i) the signal FDBCK at the output 126 and (ii) the signal CLK in response to (a) the signal REF, (b) the signal SSON_A, (c) the signal SSON_B, and (d) the signal SSON. The signal FDBCK may be used as a control signal.

Figure 4:
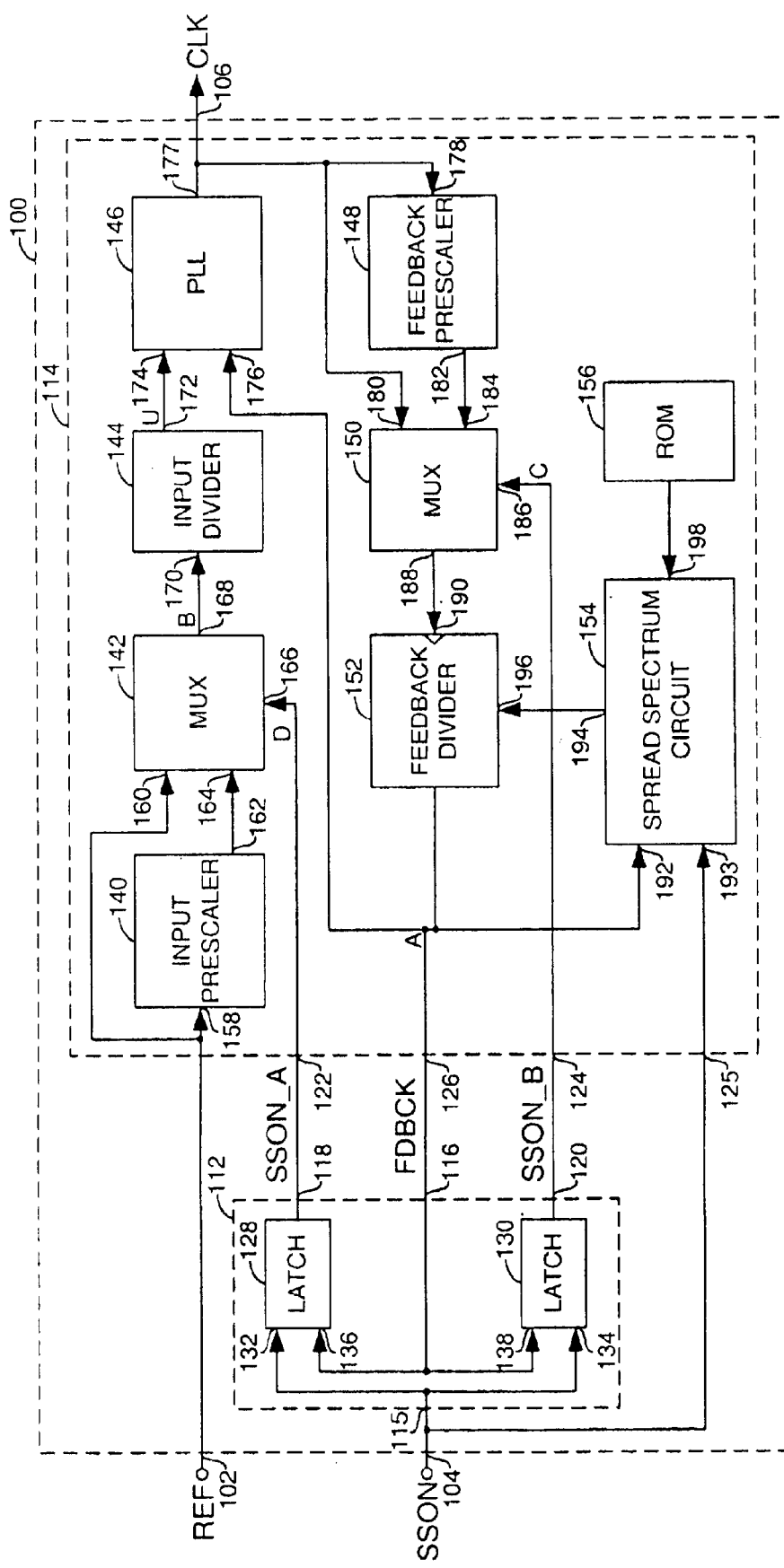
FIG. 4 is a more detailed block diagram illustrating a preferred embodiment of the present invention.

Referring to FIG. 4, a more detailed block diagram of the circuit 100 is shown. The circuit 112 generally comprises, in one example, a latch 128 and a latch 130. The signal SSON is generally presented at an input 132 of the latch 128 and an input 134 of the latch 130. The signal FDBCK is generally presented to a control input 136 of the latch 128 and a control input 138 of the latch 130. The signal SSON_A is generally presented by the latch 128 in response to (i) the signal SSON and (ii) the signal FDBCK. The signal SSON_B is generally presented by the latch 130 in response to (i) the signal SSON and (ii) the signal FDBCK. In an alternative embodiment (not shown), the circuit 112 may comprise a single latch. In the example of a single latch, the signal SSON_A and the signal SSON_B may be the same signal.

The circuit 114 generally comprises, in one example, an input prescaler 140, a multiplexer 142, an input divider 144, a phase lock loop (PLL) 146, a feedback prescaler 148, a multiplexer 150, a feedback divider 152, a spread spectrum circuit 154, and a ROM 156. The signal REF is generally presented to an input 158 of the input prescaler 140 and an input 160 of the multiplexer 142. An output 162 of the input prescaler 140 is generally connected to an input 164 of the multiplexer 142. The signal SSON_A is generally presented to a control input 166 of the multiplexer 142. An output 168 of the multiplexer 142 is generally connected to an input 170 of the input divider 144. An output 172 of the input divider 144 is generally connected to an input 174 of the PLL 146. The signal FDBCK is generally presented to an input 176 of the PLL 146. The PLL 146 may be configured to generate the signal CLK.

The signal CLK is generally presented to an input 178 of the feedback prescaler 148 and an input 180 of the multiplexer 150. An output 182 of the feedback prescaler 148 is generally connected to an input 184 of the multiplexer 150. The signal SSON_B is generally presented at a control input 186 of the multiplexer 150. An output 188 of the multiplexer 150 is generally connected to a clock input 190 of the feedback divider 152. The feedback divider 152 may be configured to generate the signal FDBCK.

The signal FDBCK is generally presented to an input 192 of the spread spectrum circuit 154. The signal SSON is generally presented to an input 193 of the spread spectrum circuit 154. An output 194 of the spread spectrum circuit 154 is generally connected to an input 196 of the feedback divider 152. A sequence of spread spectrum ROM codes from the ROM 156 may be presented, in one example, at an input 198 of the spread spectrum circuit 154. However, other connections between the spread spectrum circuit 154 and the ROM 156 may be implemented accordingly to meet the design criteria of a particular application. The spread spectrum circuit 154 may be configured to control the feedback divider 152 in response to the sequence of spread spectrum ROM codes.

Figure 5:
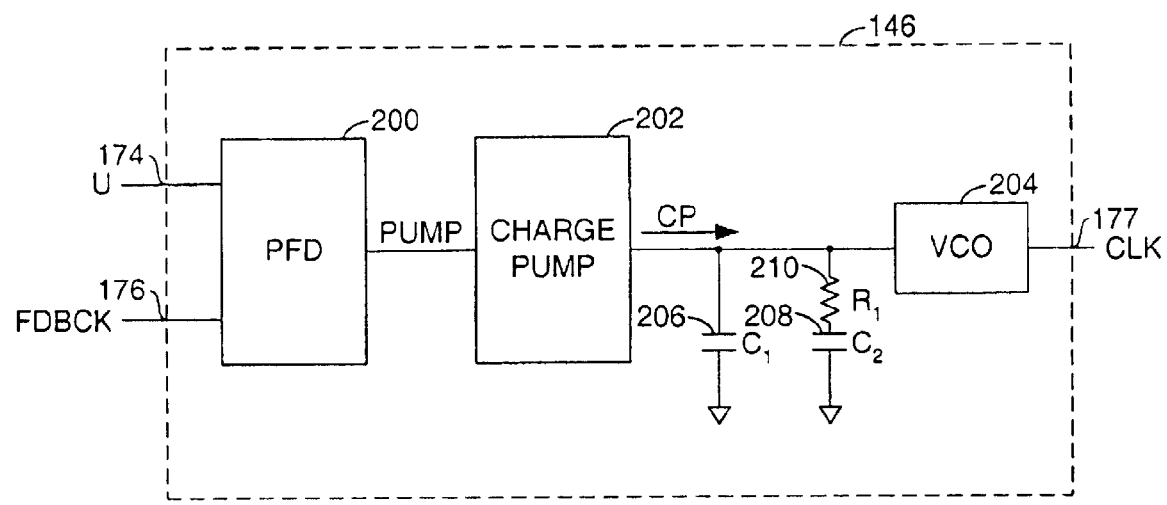
FIG. 5 is a more detailed diagram of the PLL circuit of FIG. 4.

Referring to FIG. 5, a more detailed diagram of the PLL 146 of FIG. 4 is shown. The PLL 146 may comprise a phase frequency detector (PFD) 200, a charge pump 202, a voltage controlled oscillator (VCO) 204, a capacitor 206, a capacitor 208, and a resistor 210. A reference signal (e.g., U) is generally presented to a first input of the PFD 200. The signal FDBCK is generally presented to a second input of the PFD 200. The PFD 200 may be configured, in one example, to generate a pump signal (e.g., PUMP) in response to (i) the signal U and (ii) the signal FDBCK.

The signal PUMP is generally presented, in one example, to an input of the charge pump 202. The charge pump 202 may be configured to generate a control signal (e.g., CP) in response to the signal PUMP. The signal CP may be a current signal. The signal CP is generally presented to a node formed by (i) an input of the VCO 204, (ii) a first terminal of the capacitor 206, and (iii) a first terminal of the resistor 210. A second terminal of the capacitor 206 is generally connected to a ground potential. A second terminal of the resistor 210 is connected to a first terminal of the capacitor 208. A second terminal of the capacitor 208 is generally connected to the ground potential. The VCO 204 may be configured to generate the signal CLK in response to the signal CP.

In the present invention, the switching on or switching off of spread spectrum modulation is generally synchronized to the signal FDBCK. The selection between a signal and a prescaled version of the signal by the multiplexers 142 and 150 may be synchronized with the updating of the feedback divider. The feedback divider may be controlled by the spread spectrum circuit 154 in response to an optimized sequence of spread spectrum ROM codes. The sequence of spread spectrum ROM codes may be optimized to reduce undershoot and overshoot of the frequency of the signal CLK during a spread spectrum transition. The process of optimization generally begins by generating the ROM codes according to a predetermined mathematical formula. In a preferred embodiment, the following mathematical formula may be used:

$$\begin{bmatrix} X1(N+1) \\ X2(N+1) \\ X3(N+1) \end{bmatrix} = \begin{bmatrix} 0 & -\frac{VCO}{FBD(N+1)} & 0 \\ \frac{CP(N+1)}{C1} & -\frac{1}{C1 \cdot R1} & -\frac{1}{C1 \cdot R1} \\ 0 & \frac{1}{C2 \cdot R1} & -\frac{1}{C2 \cdot R1} \end{bmatrix} \begin{bmatrix} X1(N) \\ X2(N) \\ X3(N) \end{bmatrix} *$$

$$\Delta t(N) + \begin{bmatrix} U1(N+1) \\ U2(N+1) \\ U3(N+1) \end{bmatrix} * \Delta t(N) + \begin{bmatrix} X1(N) \\ X2(N) \\ X3(N) \end{bmatrix}$$

Reading the equation in connection with FIG. 4 and FIG. 5, the term VCO is generally the gain of the voltage controlled oscillator 204. C1 and C2 are generally the capacitance values of the capacitor 206 and the capacitor 208, respectively. R1 is generally the resistance value of the resistor 210. In one example, R1 may be 40 KΩ when spread spectrum modulation is OFF and 24 KΩ when spread spectrum modulation is ON. The term FBD is generally the feedback divider value of feedback divider 152. The term Δt (N) is generally the time interval between the last time step and present time. U(N) is generally the reference signal presented to the input 174 of the PLL 146. The term CP(N) is generally the current from an output of the charge pump 202. The particular values of the various variables may be modified or optimized accordingly to meet the design criteria of a particular implementation. Additionally, the formula listed is one example of a formula that may be used to generate ROM codes. Other formulas may be substituted in particular design applications.

When the generation of spread spectrum ROM codes is complete, the sequence of the spread spectrum ROM codes generated may be optimized by a process described below in connection with FIG. 7.

Referring to FIG. 6, a timing diagram and an oscilloscope trace illustrating various signals of the circuit 100 is shown. In the timing diagram, a transition 220 in the signal SSON is synchronized with a transition 222 in the signal FDBCK to generate the transitions 224 and 226 in the signals SSON_A and SSON_B, respectively. Simulation and measured examples of the signal CLK illustrating the spread spectrum transient behaviors as generally controlled by the present invention are also shown.

Referring to FIG. 7, a waveform diagram illustrating the criteria for determining whether spread spectrum transient behavior is good (e.g., within acceptable design tolerances) or bad (e.g., not within acceptable design tolerances) is shown. A value foff is generally the unmodulated frequency of the signal CLK. A value fmax is generally the maximum frequency of the signal CLK when spread spectrum modulation is on. A value fmin is generally the minimum frequency of the signal CLK when spread spectrum modulation is on. A function f(t) generally represents the changes in the frequency of the signal CLK during the transition time period. A value Δf generally represents the peak to peak frequency range of the signal CLK when spread spectrum modulation is on. The sequence of the spread spectrum ROM codes is generally considered optimized when the function f(t) is greater than or substantially equal to the value fmin and less than or substantially equal to the value foff.

Figure 8:
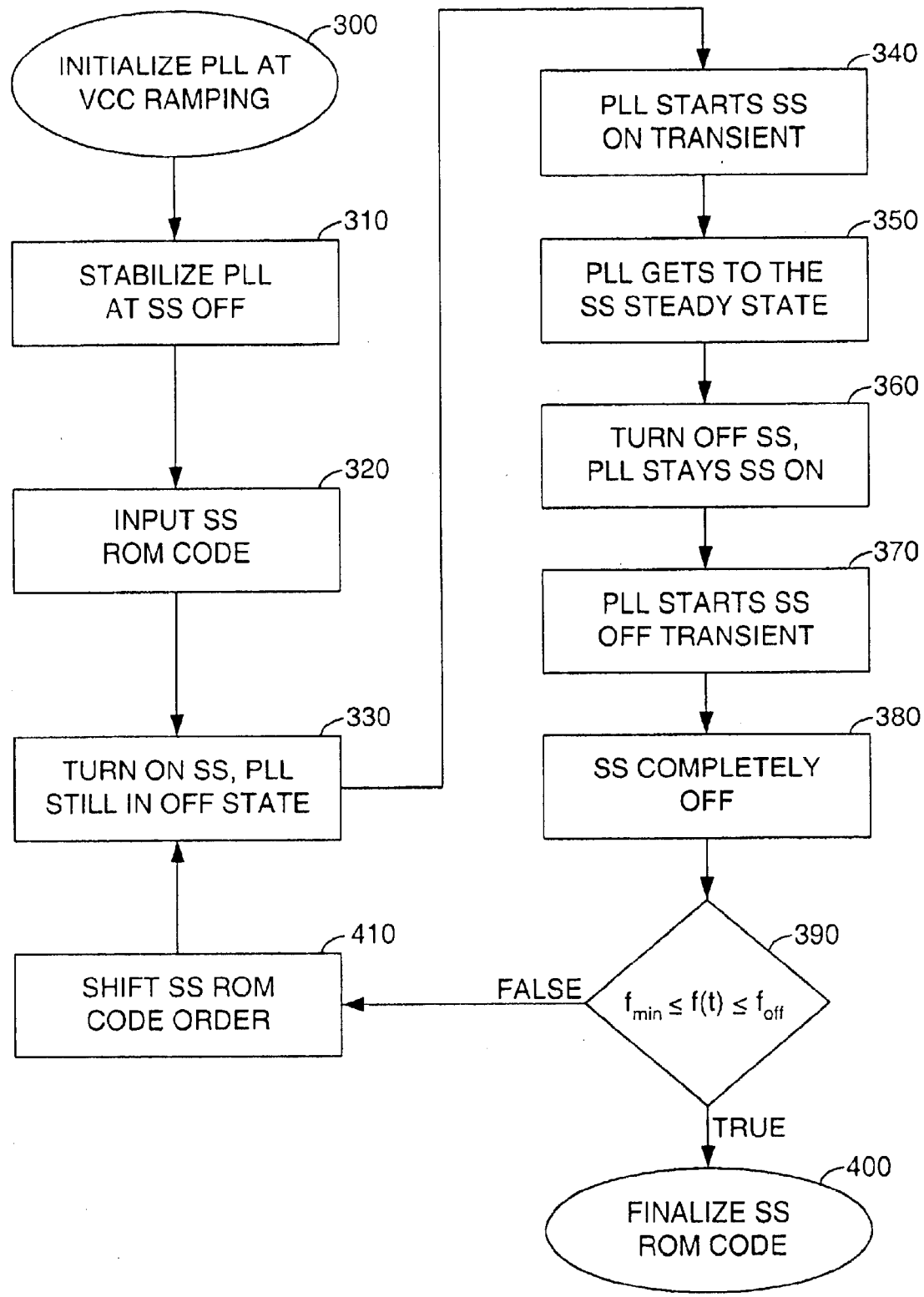
FIG. 8 is a flow chart illustrating a process for optimizing a sequence of spread spectrum ROM codes in accordance with a preferred embodiment of the present invention.

Referring to FIG. 8, a flow chart illustrating a process for optimizing the sequence of spread spectrum ROM codes is shown. The process may be performed, in one example, using a computer program to simulate the transient and steady-state spread spectrum behavior of the circuit 100.

The circuit 100 is generally initialized at power supply ramping (e.g., block 300). The circuit 100 is generally allowed to reach a steady-state condition with the signal SSON in an unasserted state indicating no modulation (e.g., block 310). The sequence of spread spectrum ROM codes, generated as described above, is generally loaded (e.g., block 320).

The signal SSON is generally asserted to begin spread spectrum modulation (e.g., block 330). The circuit 100 is generally allowed to move (i) from a steady-state condition with no modulation, (ii) through spread spectrum start-up transient behavior (e.g., block 340), and (iii) into a steady-state condition with spread spectrum modulation on (e.g., block 350).

When the circuit 100 has reached the steady-state with spread spectrum modulation on, the signal SSON is generally de-asserted (e.g., block 360). The circuit 100 is then allowed to move (i) from the steady-state condition with modulation on, (ii) through spread spectrum turn off transient behavior (e.g., block 370), and (iii) to a steady-state condition with no modulation of the signal CLK (e.g., block 380).

The frequency changes of the signal CLK (e.g., f(t)) during the transition periods are compared with predetermined criteria (e.g., block 390). The comparison determines, whether or not, the frequency was (i) below the predetermined minimum value (e.g., fmin) or (ii) above the frequency of the signal CLK with no modulation (e.g., foff).

If the frequency changes of the signal CLK did not exceed the range (e.g., fmin≦f(t)≦foff), the sequence of ROM codes is generally considered optimized (e.g., block 400). If the frequency changes of the signal CLK were outside the predetermined range (e.g., f(t)<fmin or f(t)>foff), the sequence of spread spectrum ROM codes is generally shifted one position (e.g., block 410). The process may be repeated until the predetermined criteria are met (e.g., blocks 330–410).

Figure 9:
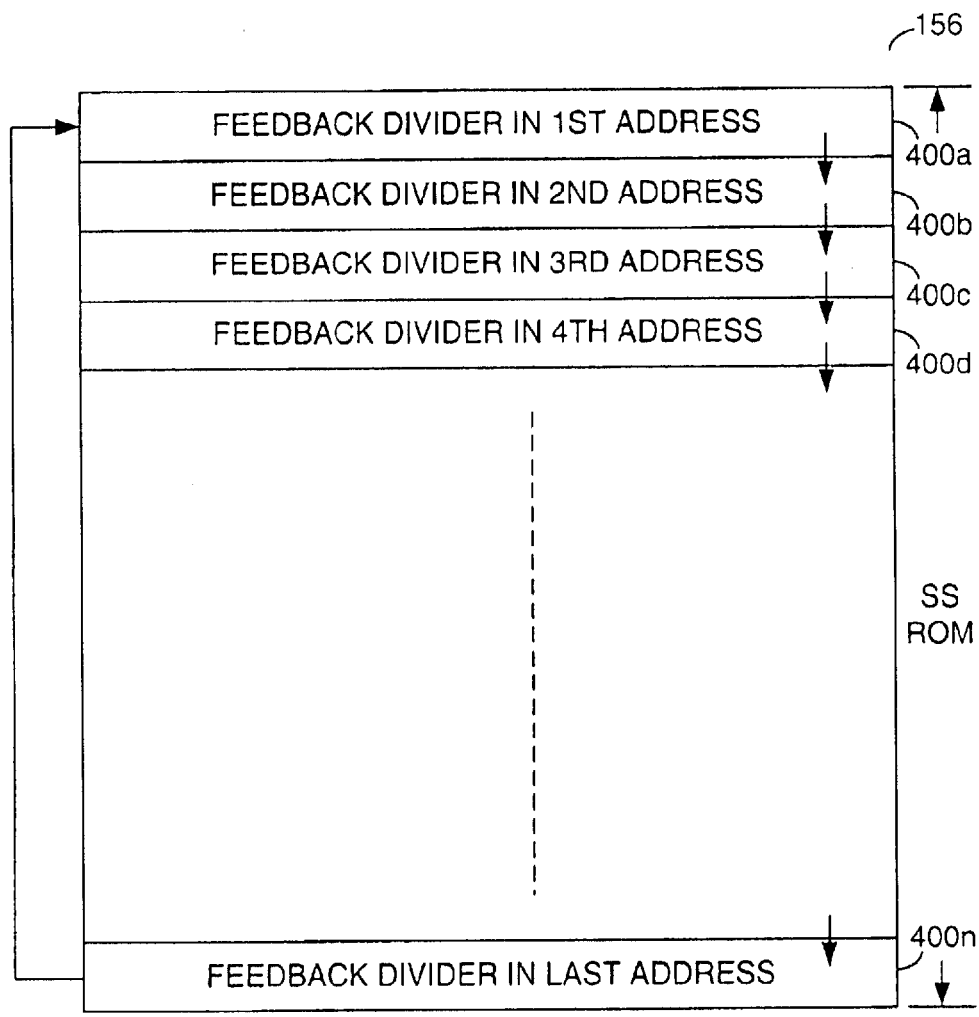
FIG. 9 is a diagram illustrating the optimization of a spread spectrum ROM code sequence.

Referring to FIG. 9, a more detailed block diagram of the ROM 156 illustrating the process of shifting the spread spectrum ROM code, as mentioned in the block 410 of FIG. 8, is shown. If the criteria for the transient response have not been met, the feedback divider value in the last address location 400n of the spread spectrum ROM 156 is generally moved to the first address location 400a. All other values in the ROM 156 are generally shifted to the next location.

While the invention has been particularly shown and described with reference to the preferred embodiments thereof, it will be understood by those skilled in the art that various changes in form and details may be made without departing from the spirit and scope of the invention.

What is claimed is:

1. A spread spectrum clock generator circuit comprising:
   a first circuit configured to generate a clock signal in response to (i) a reference signal, (ii) a sequence of spread spectrum ROM codes, and (iii) a command signal, wherein (i) said clock signal is spread spectrum modulated and (ii) said spread spectrum modulation of said clock signal is switched on in response to a first state of said command signal and switched off in response to a second state of said command signal; and a second circuit configured to synchronize said command signal to a feedback signal, wherein said sequence of spread spectrum ROM codes is generated according to a predetermined mathematical formula and optimized in accordance with predetermined criteria.

2. The spread spectrum clock generator circuit according to claim 1, wherein said spread spectrum clock generator circuit is used with a motherboard or CPU.

3. The spread spectrum clock generator circuit according to claim 1, wherein said second circuit is further configured to generate one or more control signals in response to (i) said command signal and (ii) said feedback signal.

4. The spread spectrum clock generator circuit according to claim 3, wherein said second circuit comprises a first latch.

5. The spread spectrum clock generator circuit according to claim 4, wherein said second circuit further comprises a second latch.

6. The spread spectrum clock generator circuit according to claim 5, wherein said predetermined criteria further includes a predetermined maximum frequency for said clock signal.

7. The spread spectrum clock generator according to claim 3, wherein said first circuit further comprises:
 a first multiplexer circuit configured to select one of said reference signal and a prescaled version of said reference signal in response to said one or more control signals; and
 a second multiplexer circuit configured to select one of said clock signal and a prescaled version of said clock signal in response to said one or more control signals.

8. The spread spectrum clock generator circuit according to claim 1, wherein said predetermined criteria are applied to said clock signal during a transition period when the spread spectrum modulation is switching on or switching off.

9. The spread spectrum clock generator circuit according to claim 1, wherein said predetermined criteria includes a predetermined minimum frequency for said clock signal.

10. The spread spectrum clock generator circuit according to claim 1, wherein said predetermined mathematical formula is:

$$\begin{bmatrix} X1(N+1) \\ X2(N+1) \\ X3(N+1) \end{bmatrix} = \begin{bmatrix} 0 & -\frac{VCO}{FBD(N+1)} & 0 \\ \frac{CP(N+1)}{C1} & -\frac{1}{C1 \cdot R1} & -\frac{1}{C1 \cdot R1} \\ 0 & \frac{1}{C2 \cdot R1} & -\frac{1}{C2 \cdot R1} \end{bmatrix} \begin{bmatrix} X1(N) \\ X2(N) \\ X3(N) \end{bmatrix} *$$

$$\Delta t(N) + \begin{bmatrix} U_1(N+1) \\ U_2(N+1) \\ U_3(N+1) \end{bmatrix} * \Delta t(N) + \begin{bmatrix} X_1(N) \\ X_2(N) \\ X_3(N) \end{bmatrix},$$

where X represents a value of said clock signal, VCO represents a voltage controlled oscillator gain, C1 and C2 represent capacitance values, R1 represents a resistance value, FBD represents a feedback divider value, Δt (N) represents a time interval between a last time step and a present time, U represents said reference signal, CP represents a charge pump current and N represents a time step.

11. The spread spectrum clock generator circuit according to claim 1, wherein:
 said sequence of spread spectrum ROM codes is optimized using a computer program to simulate transient behavior.

12. The spread spectrum clock generator according to claim 1, wherein a first frequency of said clock signal when said spread spectrum modulation is switched off is greater than a second frequency of said clock signal when said spread spectrum modulation is switched on.

13. A spread spectrum clock generator circuit comprising:
 means for generating a clock signal in response to (i) a reference signal, (ii) a sequence of spread spectrum ROM codes and (iii) a command signal, wherein (i) said clock signal is spread spectrum modulated and (ii) said spread spectrum modulation of said clock signal is switched on in response to a first state of said command signal and switched off in response to a second state of said command signal; and
 means for synchronizing said command signal to a feedback signal, wherein said sequence of spread spectrum ROM codes is generated according to a predetermined mathematical formula and optimized in accordance with predetermined criteria.

14. A method for controlling a spread spectrum transition comprising the steps of:
 generating a clock signal in response to (i) a reference signal, (ii) a sequence of spread spectrum ROM codes and (iii) a command signal, wherein (i) said clock signal is spread spectrum modulated and (ii) said spread spectrum modulation of said clock signal is switched on in response to a first state of said command signal and switched off in response to a second state of said command signal; and
 synchronizing said command signal to a feedback signal, wherein said sequence of spread spectrum ROM codes is generated according to a predetermined mathematical formula and optimized in accordance with predetermined criteria.

15. The method according to claim 14, wherein the step of generating said sequence of spread spectrum ROM codes further comprises the sub-steps of:
 (A) selecting a number of ROM codes to be used to generate a spread spectrum modulation signal; and
 (B) generating said number of ROM codes according to said predetermined mathematical formula.

16. The method according to claim 15, wherein the step of selecting said ROM codes further comprises the sub-steps of:
 (A) initializing a phase lock loop (PLL) at power supply ramping;
 (B) stabilizing said PLL with spread spectrum modulation switched off;
 (C) loading said sequence of spread spectrum ROM codes;
 (D) switching on spread spectrum modulation;
 (E) recording a transient behavior of said clock signal until PLL is in spread spectrum steady-state;
 (F) switching off spread spectrum modulation;
 (G) recording the transient behavior of said clock signal until spread spectrum modulation is completely off;
 (H) comparing recorded the transient behavior to predetermined criteria;
 (I) if the recorded transient behavior does not meet said predetermined criteria, shifting said sequence of spread spectrum ROM codes, wherein a last ROM code is moved to a first position and remaining ROM codes are shifted one position forward;
 (J) if the recorded transient behavior meets said predetermined criteria, finalizing said sequence of spread spectrum ROM codes; and (K) repeating sub-steps (D) through (J) until said recorded transient response meets said predetermined criteria.

17. The method according to claim 16, wherein said sub-steps are performed by a computer program.

18. The method according to claim 14, wherein said step of generating said clock signal further comprises the sub-step of controlling a feedback divider with said sequence of spread spectrum ROM codes.

19. The method according to claim 14, wherein the step of synchronizing said command signal to said feedback signal further comprises generating one or more control signals in response to (i) said command signal and (ii) said feedback signal.

20. The method according to claim 19, wherein said one or more control signals are generated by one or more latches configured to sample said command signal in response to said feedback signal.

21. The method according to claim 19, further comprising the steps of:

selecting one of said reference signal and a prescaled version of said reference signal in response to said one or more control signals; and selecting one of said clock signal and a prescaled version of said clock signal in response to said one or more control signals.

22. An apparatus comprising:

a first circuit configured to generate a clock signal in response to (i) a reference signal, (ii) a sequence of spread spectrum ROM codes, (iii) a command signal and (iv) a feedback signal; and a second circuit configured to synchronize said command signal to said feedback signal, wherein said sequence of spread spectrum ROM codes is generated according to a predetermined mathematical formula a nd optimized using a computer program to simulate a transient behavior of said apparatus.

23. The apparatus according to claim 22, wherein said sequence of spread spectrum ROM codes is optimized in accordance with predetermined-criteria using said computer program to simulate the transient behavior of said apparatus in response to said command signal changing state.

* * * * *